United States Patent
Wu et al.

(10) Patent No.: US 7,534,711 B2
(45) Date of Patent: May 19, 2009

(54) SYSTEM AND METHOD FOR DIRECT ETCHING

(75) Inventors: Jingang Wu, Shanghai (CN); Fei Luo, Shanghai (CN); Guanqie Gao, Shanghai (CN); Cheng Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 71 days.

(21) Appl. No.: 11/615,972

(22) Filed: Dec. 23, 2006

(65) Prior Publication Data

US 2008/0146030 A1    Jun. 19, 2008

(30) Foreign Application Priority Data

Dec. 15, 2006  (CN) .................. 2006 1 0147453

(51) Int. Cl.
  *H01L 21/20* (2006.01)
(52) U.S. Cl. .................. 438/595; 438/586; 438/587; 438/592; 438/597; 438/634; 257/E21.026; 257/E21.257; 257/E21.275; 257/E21.279; 257/E21.507; 257/E21.577; 257/E21.579; 257/E21.648
(58) Field of Classification Search .................. 438/637, 438/618, 672, 303, 585, 586, 587, 592, 595, 438/597, 634; 257/E21.026, 252, 257, 275, 257/279, 293, 507, 577, 579, 648
  See application file for complete search history.

(56) References Cited

U.S. PATENT DOCUMENTS

| | | | | |
|---|---|---|---|---|
| 5,817,562 A * | 10/1998 | Chang et al. | ................. | 438/305 |
| 5,879,986 A * | 3/1999 | Sung | ................. | 438/253 |
| 5,932,491 A * | 8/1999 | Wald et al. | ................. | 438/734 |
| 6,069,077 A * | 5/2000 | Lee et al. | ................. | 438/675 |
| 6,194,302 B1 * | 2/2001 | Shen | ................. | 438/597 |
| 6,214,843 B1 * | 4/2001 | Kadowaki et al. | ................. | 514/322 |
| 6,350,665 B1 * | 2/2002 | Jin et al. | ................. | 438/585 |
| 6,498,081 B2 * | 12/2002 | Chi et al. | ................. | 438/586 |
| 6,569,778 B2 * | 5/2003 | Lee et al. | ................. | 438/734 |
| 6,653,228 B2 * | 11/2003 | Choi et al. | ................. | 438/637 |
| 6,777,305 B2 * | 8/2004 | Lee et al. | ................. | 438/396 |
| 6,867,145 B2 * | 3/2005 | Lee et al. | ................. | 438/706 |
| 6,878,637 B2 * | 4/2005 | Lee | ................. | 438/725 |
| 2004/0241940 A1 * | 12/2004 | Lee et al. | ................. | 438/256 |
| 2006/0258145 A1 * | 11/2006 | Lee et al. | ................. | 438/618 |

* cited by examiner

*Primary Examiner*—Michael S Lebentritt
(74) *Attorney, Agent, or Firm*—Townsend and Townsend and Crew, LLP

(57) ABSTRACT

System and method for direct etching. According to an embodiment, the present invention provides a method for manufacturing an integrated circuit device. The method includes a step for providing a substrate having a contact region, which is provided between a first word line and a second word line. The contact region has an overlying plug structure, which is provided within a thickness of a first dielectric layer. The first dielectric layer includes a portion overlying the plug structure. The first dielectric layer has a planarized surface region. The method also includes a step for forming a first line and a second line and a space provided between the first word line and the second world line. The space is provided within a region overlying the plug structure.

16 Claims, 10 Drawing Sheets

SYSTEM AND METHOD FOR DIRECT ETCHING

CROSS-REFERENCES TO RELATED APPLICATIONS

This application claims priority to Chinese Patent No. 200610147453.2 filed on Dec. 15, 2006, commonly assigned and hereby incorporated by reference for all purposes.

BACKGROUND OF THE INVENTION

The present invention is directed to integrated circuits and their processing for the manufacture of semiconductor devices. More particularly, the invention provides a method and device for the contact etching process for the manufacture of integrated circuits. Merely by way of example, the invention has been applied to a direct hole etching process for the manufacture of integrated circuits. But it would be recognized that the invention has a much broader range of applicability. For example, the invention can be applied to the deep trench processes for forming contact structures.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Making devices smaller is very challenging, as each process used in IC fabrication has a limit. That is to say, a given process typically only works down to a certain feature size, and then either the process or the device layout needs to be changed. An example of such a limit is chemical dry etching process used for the manufacture of integrated circuits in a cost effective and efficient way.

The manufacturing of integrated circuits involves various processes. For example, the processes include, inter alia, wafer growth, photolithography, doping, oxidation, deposition, etching removal, and epitaxial growth.

Generally, photolithography process is used to define and shape specific areas of the wafer to suit particular design of integrated circuit. Usually, a layout design used to create an optical mask (or reticle pattern, depending on application). The wafer surface is usually covered with a layer of photoresist. The wafer is then exposed to light through the optical mask. After light exposure, the areas of photoresist that were exposed to light are removed using chemical process. As a result, the wafer contains both clear areas (where photoresist is removed) and areas blocked by photoresist. Next, various processes (such as etching, oxidation, diffusion, etc.) only affecting clear areas are performed. After various processes are finished, photoresist materials are then removed.

Etching is an important process in semiconductor manufacturing. Etching involves removing selected regions from the surface of a wafer using physical process, chemical process, or the combination thereof. Usually the goal of etching is to faithfully reproduce masking patterns. To achieve this goal, it is often desirable to for the etching process to be highly selective both in patterns and depth, which is often achieve through chemical dry etching.

Chemical drying etching usually involves generating reactive species in plasma, diffusing these species to the surface of material being etched, species being absorbed, reacting of these species on the surface to form volatile by-product, absorbing or the by-product by the surface, and diffusing of the desorbed species diffusing into gas. There are many various dry-etch systems to accomplish these steps. For example, dry-etch systems include barrel etchers, downstream etchers, parallel-electrode (planar) reactor etchers, stacked parallel-electrode etchers, hexode batch etchers, magnetron ion etchers, etc.

As integrated circuits become smaller, various conventional techniques have been developed. In recent years, self-aligned contact (SAC) etching process has been used for a variety of purposes. More specifically, SAC processes are widely used in manufacturing memory devices, where spacers for address lines are also used for aligning contact regions. The SAC processes have various advantages in their applications. Unfortunately, conventional techniques such as SAC processes are often inadequate.

Therefore, an improved method for etching process is desired.

BRIEF SUMMARY OF THE INVENTION

The present invention is directed to integrated circuits and their processing for the manufacture of semiconductor devices. More particularly, the invention provides a method and device for the contact etching process for the manufacture of integrated circuits. Merely by way of example, the invention has been applied to a direct hole etching process for the manufacture of integrated circuits. But it would be recognized that the invention has a much broader range of applicability. For example, the invention can be applied to the deep trench processes for forming contact structures.

According to an embodiment, the present invention provides a method for manufacturing an integrated circuit device. The method includes a step for providing a substrate having a contact region, which is provided between a first word line and a second word line. The contact region has an overlying plug structure, which is provided within a thickness of a first dielectric layer. The first dielectric layer includes a portion overlying the plug structure. The first dielectric layer has a planarized surface region. The method also includes a step for forming a first line and a second line and a space provided between the first word line and the second world line. The space is provided within a region overlying the plug structure. Additionally, the method includes a step for forming a plurality of spacers, which include a first spacer overlaying the first line and a second spacer overlaying the second line. For example, the first spacer is characterized by a width and a height. The method also includes a step for forming a second dielectric layer overlying the plurality of spacers. Also, the method includes a step for planarizing the second dielectric layer. Moreover, the method includes a step for forming a hard mask. Additionally, the method includes a step for patterning the hard mask to form a first exposed region. Furthermore, the method includes a step for forming a thickness of spacer material. The method also includes a step for performing anisotropic etching the thickness of the spacer material to form a second exposed region within the first exposed region. The second exposed region is defined by a first sidewall spacer on a first edge of the first exposed region and a second sidewall spacer on a second edge of the first exposed region. The method also further includes a step for performing an etching process within the second exposed region at a depth to form an opening. Also, the method includes a step for forming a contact within the opening.

According to an embodiment, the present invention provides a method for manufacturing an integrated circuit device. The method includes a step for providing a substrate having a contact region, which is provided between a first word line and a second word line. The contact region has an overlying plug structure, which is provided within a thickness of a first dielectric layer. The first dielectric layer includes a portion overlying the plug structure. The first dielectric layer has a planarized surface region. The method also includes a step for forming a first line and a second line and a space provided between the first word line and the second world line. The space is provided within a region overlying the plug structure. Additionally, the method includes a step for forming a plurality of spacers, which include a first spacer overlaying the first line and a second spacer overlaying the second line. For example, the first spacer is characterized by a width and a height. The method also includes a step for forming a second dielectric layer overlying the plurality of spacers. Also, the method includes a step for planarizing the second dielectric layer. The method also includes a step for forming a hard mask overlaying the dielectric layer. Furthermore, the method includes a step for patterning the hard mask to form a first exposed region. The method further includes a step for forming a thickness of spacer material. The method also includes a step for forming a second exposed region within the first exposed region, which is defined by a first sidewall spacer on a first edge of the first exposed region and a second sidewall spacer on a second edge of the first exposed region. Moreover, the method includes a step for performing an etching process within the second exposed region at a depth to form an opening. Also, the method includes a step for forming a contact within the opening. In addition, the method includes a step for removing the hard mask.

Many benefits are achieved by way of the present invention over conventional techniques. For example, the present technique provides an easy to use process that relies upon conventional technology. In some embodiments, the method provides a direct etching process where devices may be manufactured with smaller sizes in comparison to conventional techniques. For example, smaller sizes are achieved by reducing the sizes of spacers used for address lines. Also, various embodiments of the present invention provides more process margin and reduces thermal budges when compared to conventional techniques. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

The present invention is directed to integrated circuits and their processing for the manufacture of semiconductor devices. More particularly, the invention provides a method and device for the contact etching process for the manufacture of integrated circuits. Merely by way of example, the invention has been applied to a direct hole etching process for the manufacture of integrated circuits. But it would be recognized that the invention has a much broader range of applicability. For example, the invention can be applied to the deep trench processes for forming contact structures.

As explained above, various conventional techniques have been developed for etching. The abovementioned SAC process has been widely adopted for forming contact hole between address lines. While self-aligned processes have various advantages, these processes are often inadequate for various reasons.

Figure 1:
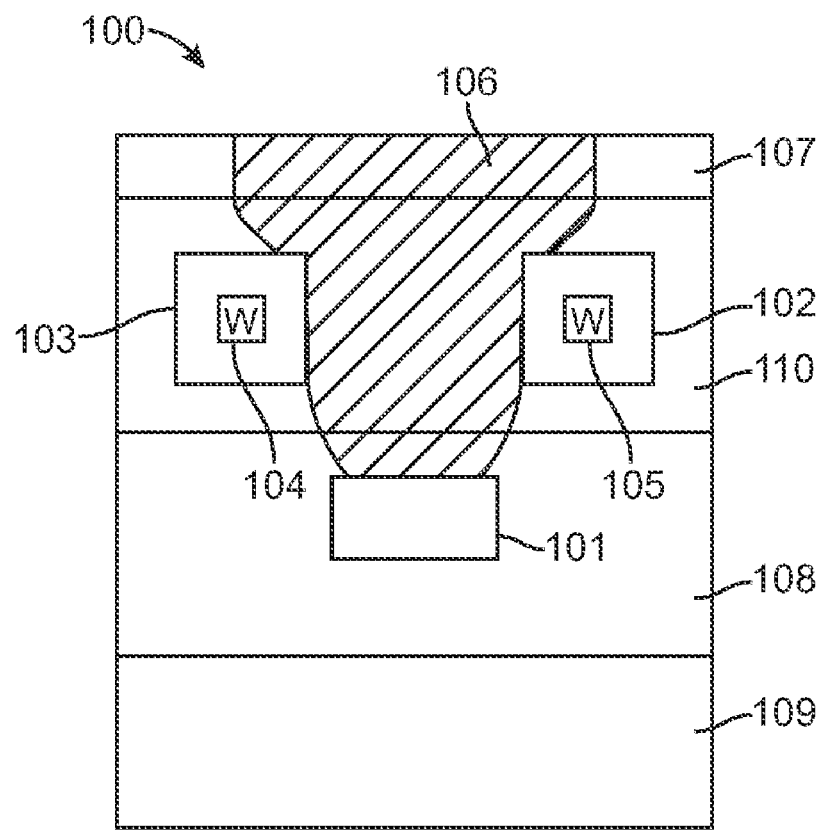
FIG. 1 is a simplified diagram illustrating a self-aligned contact process according to conventional techniques.

FIG. 1 is a simplified diagram illustrating a self-aligned contact process according to conventional techniques. In a partially processed integrated circuit 100, one or more layers of dielectric materials are formed over a substrate 109. Within a layer 108 of dielectric material, a contract region with a contact 101 is provided. Over the layer 108, another layer 110 of dielectric material is deposited. Within the layer 110, address lines 104 and 105 are formed within spacers 102 and 103.

In an SAC process, spacers for address lines often serve two or more purposes. In addition to providing isolation for address lines, spacers are also used to provide alignment when etching process is performed for forming contact holes.

As shown in FIG. 1, a hard mask layer 107 overlays the layer 110. The hard mask layer 107 has a wide opening region 106. During an anisotropic etching process, the spacers 102 and 103 guide the etching so a contact hole is formed between the spacers.

Self-aligned contact structures have been widely used. Unfortunately, there are various disadvantages. Among other things, processes for forming SAC structure provide very little margin of error. As can be seen from FIG. 1, portions of the spacer material that insulates address lines are etched away during the contact etching process. As a result, it is often necessary for the spacers to be relatively large so that the etching process does not expose the address lines. For example, thickness of the spacer materials is often more than three hundred angstroms. In comparison, as will be shown below, various embodiments of the present invention do not rely on spacers to provide etching guide, thus allowing more compact spacing to be formed between address lines.

Figure 2:
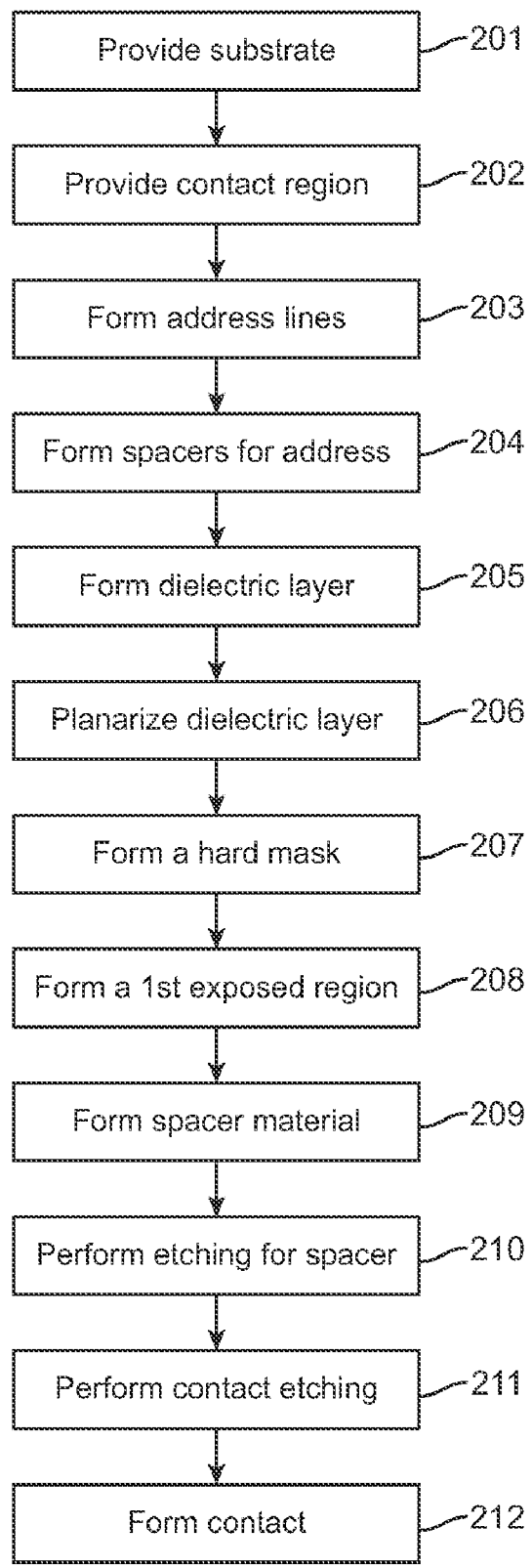
FIG. 2 is a simplified flow diagram illustrating a processing for forming a contact according to an embodiment of the present invention.

FIG. 2 is a simplified flow diagram illustrating a processing for forming a contact according to an embodiment of the present invention. This diagram is merely an example, which should not unduly limit the scope of the claims. One of ordinary skill in the art would recognize many variations, alternatives, and modifications. As an example, various steps may be added, removed, repeated, replaced, rearranged, overlapped, and/or partially overlapped.

In step 201, a substrate material is provided. Typically, the substrate material consists essentially of pure silicon material. Depending upon application, various doping and/or impurities may be present in the substrate material.

In step 202, a contract region is formed. According to an embodiment, a contact region is formed on one or more layers of dielectric material overlaying the substrate material. For example, one or more layers of dielectric material with various structures are formed over the substrate material. A contact region is defined within the layers of dielectric materials.

Figure 3:
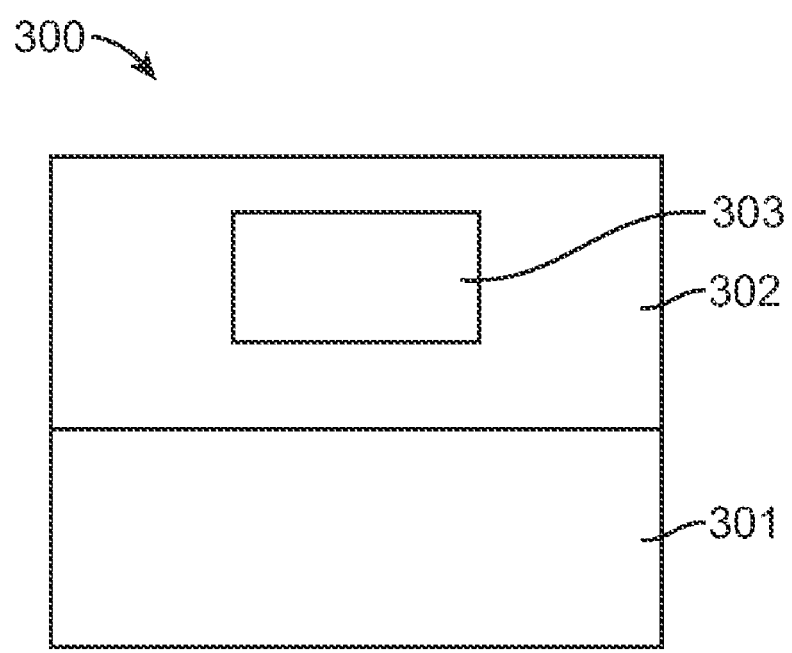
FIG. 3 is a simplified diagram illustrating a partially processed integrated circuit.

FIG. 3 is a simplified diagram illustrating a partially processed integrated circuit. This diagram is merely an example, which should not unduly limit the scope of the claims. One of ordinary skill in the art would recognize many variations, alternatives, and modifications. As shown in FIG. 3, a partially processed integrated circuit 300 includes a substrate 301. Overlaying the substrate 301 is a layer 302 of dielectric material. Depending upon application, various structures may be formed within the layer 302. Within the layer 302, a contact region is defined. For example, the contact region includes electrically conducting materials.

Now referring back to FIG. 2. At step 203, lines are formed. Depending up application, various types of lines may be formed. For example, different types of address lines such as bit line, word line, etc, maybe formed.

At step 204, spacers are formed for the lines. According to various embodiments, spacers are provided for insulating and protecting the lines. As an example, in a direct contact hole process according to the present invention, spacers are not used for aligning contacts, and therefore the thickness of the spacers according to the present invention is much less in comparison to spacers thickness as in SAC processes.

Figure 4:
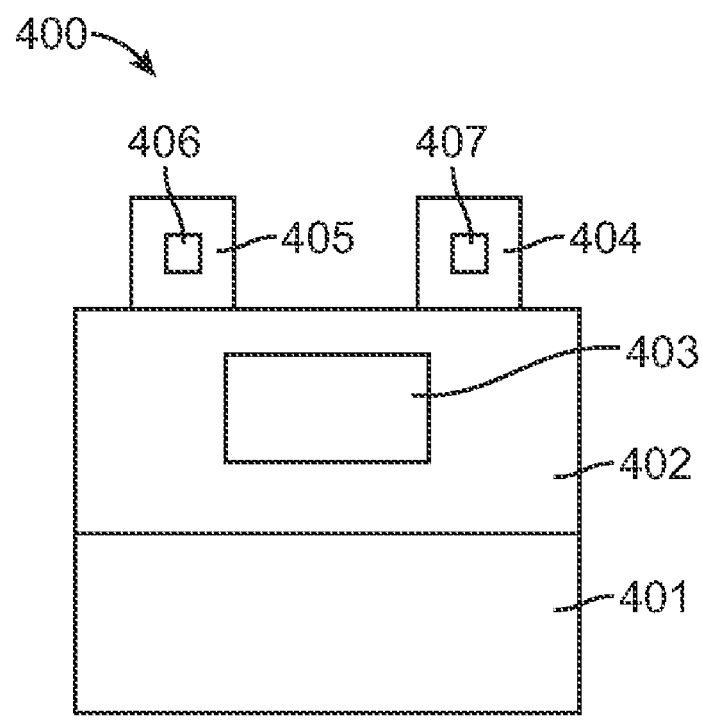
FIG. 4 is a simplified diagram illustrating a partially processed integrated circuit according to an embodiment of the present invention.

FIG. 4 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As shown in FIG. 4, lines 406 and 407 are enclosed by spacers 404 and 405. As an example, spacers 404 and 405 are characterized by a spacer width of approximately 100 angstroms.

Now referring back to FIG. 2. At step 205, a layer of dielectric is deposited. Depending upon application, various deposition methods may be used. For example, high density plasma process may be used for depositing dielectric material. It is to be understood that other types of materials and/or methods may be used as well.

Since the processed integrated circuit is not flat (e.g., addresses lines at various locations, etc.), a contour may be formed.

Figure 5:
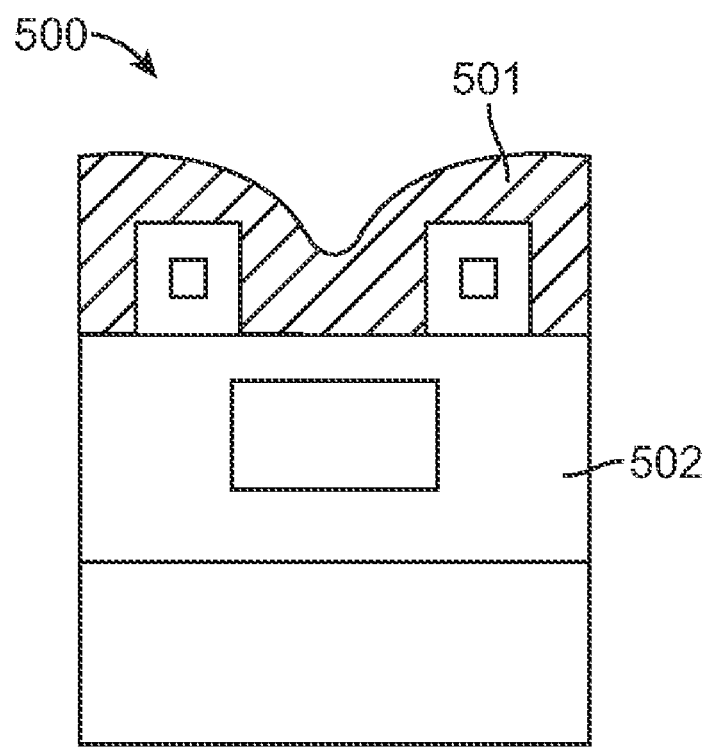
FIG. 5 is a simplified diagram illustrating a partially processed integrated circuit according to an embodiment of the present invention.

FIG. 5 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As shown, a layer 501 of dielectric material is deposited over lines and layer 502. A contour which generally conforms to the spacing of the lines is formed.

Now referring back to FIG. 2. At step 206, the newly deposited dielectric layer is planarized. According to an embodiment, chemical mechanical polishing (CMP) process is performed to flatten the newly deposited dielectric layer. Depending upon application, other types of processes may be performed for planarizing the newly deposited dielectric layer.

At step 207, a layer of hard mask is deposited. Depending upon application, various types of material may be used for forming the hard mask. For example, polysilicon material may be used for forming hard mask.

At step 208, an exposed region is formed on the hard mask. For example, the exposed region is formed by an etching process.

Figure 6:
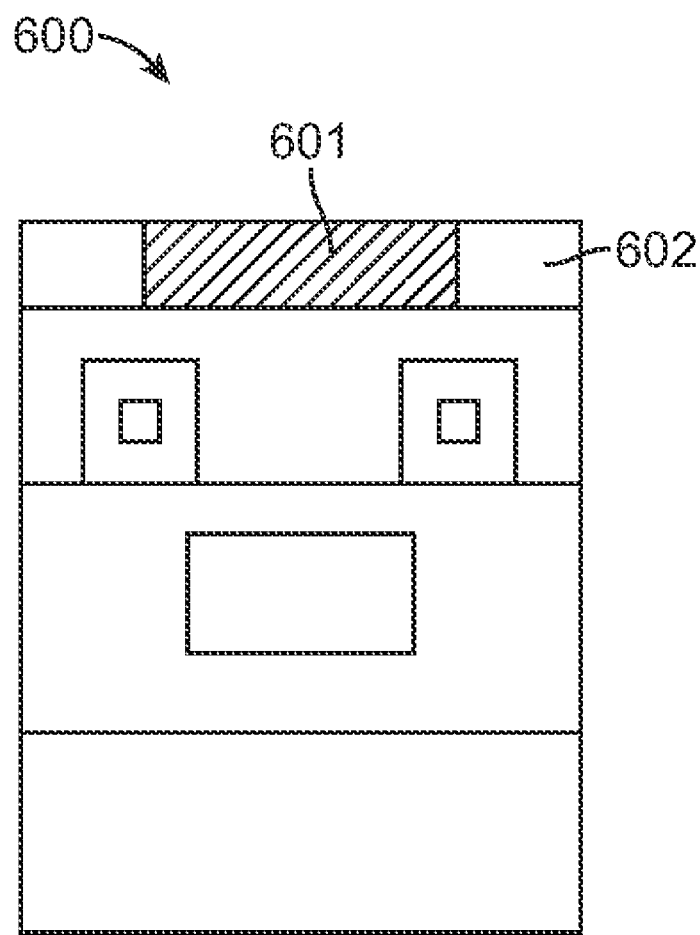
FIG. 6 is a simplified diagram illustrating a partially processed integrated circuit according to an embodiment of the present invention.

FIG. 6 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As shown in FIG. 6, an exposed region 601 is formed on the hard mask layer 602 through etching process. As can be seen, due to various reasons (e.g., reticle resolution, etc.), the size of the exposed region 601 is greater than the space between the two lines and the underlying contact. It is to be appreciated that various embodiments of the present invention allows the size of the exposed region to be reduced.

Now referring back to FIG. 2. At step 209, a layer of spacer material is formed. According to a specific embodiment, the spacer material consists essentially of the same material as the material used for the hard mask (e.g., polysilicon material).

Figure 7:
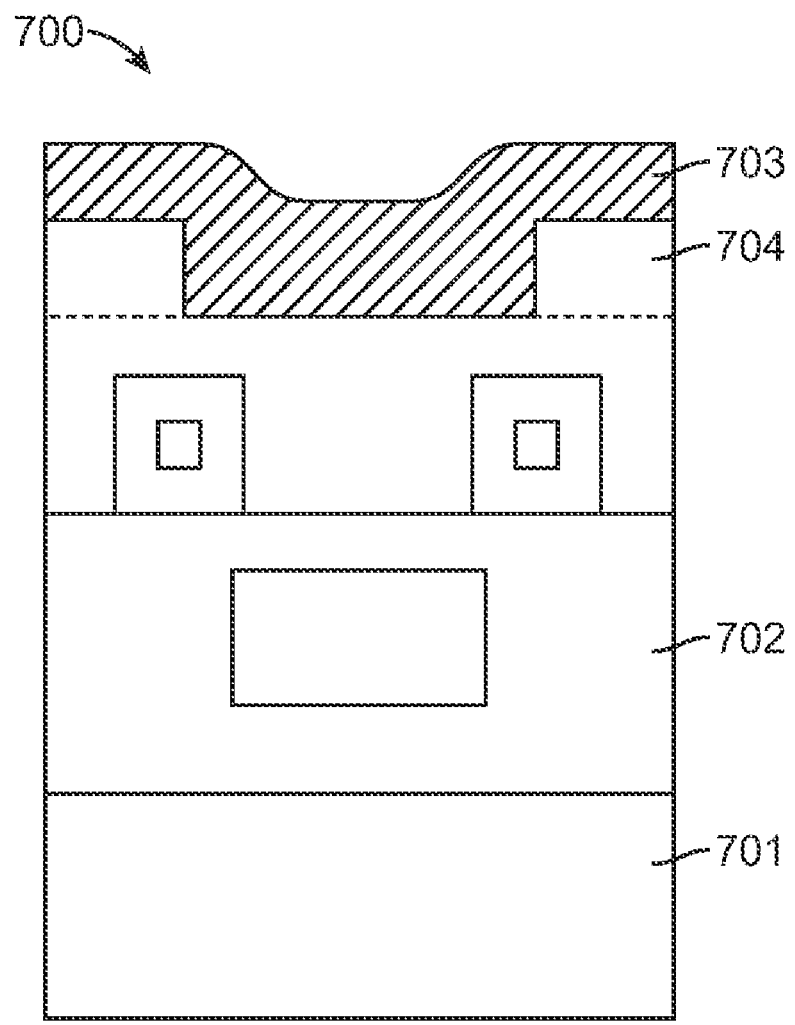
FIG. 7 is a simplified diagram illustrating a partially processed integrated circuit according to an embodiment of the present invention.

FIG. 7 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As can be seen in FIG. 7, due to the opening at the exposed region in the hard mask layer 704, the spacer layer 703 exhibits a contour conforming to the exposed region.

Now referring back to FIG. 2. At step 210, etching is performed to form spacers for the exposed region. According to various embodiments, anisotropic etching (e.g., unidirectional etching) is performed. As a result of the etching process, spacers are formed at the exposed region, reducing the size of the exposed region. For example, the size of the spacers is controlled by the thickness of the spacer layer formed at step 209. In a specific embodiment, the newly defined exposed region is substantially smaller than the space between the address lines underneath.

Figure 8:
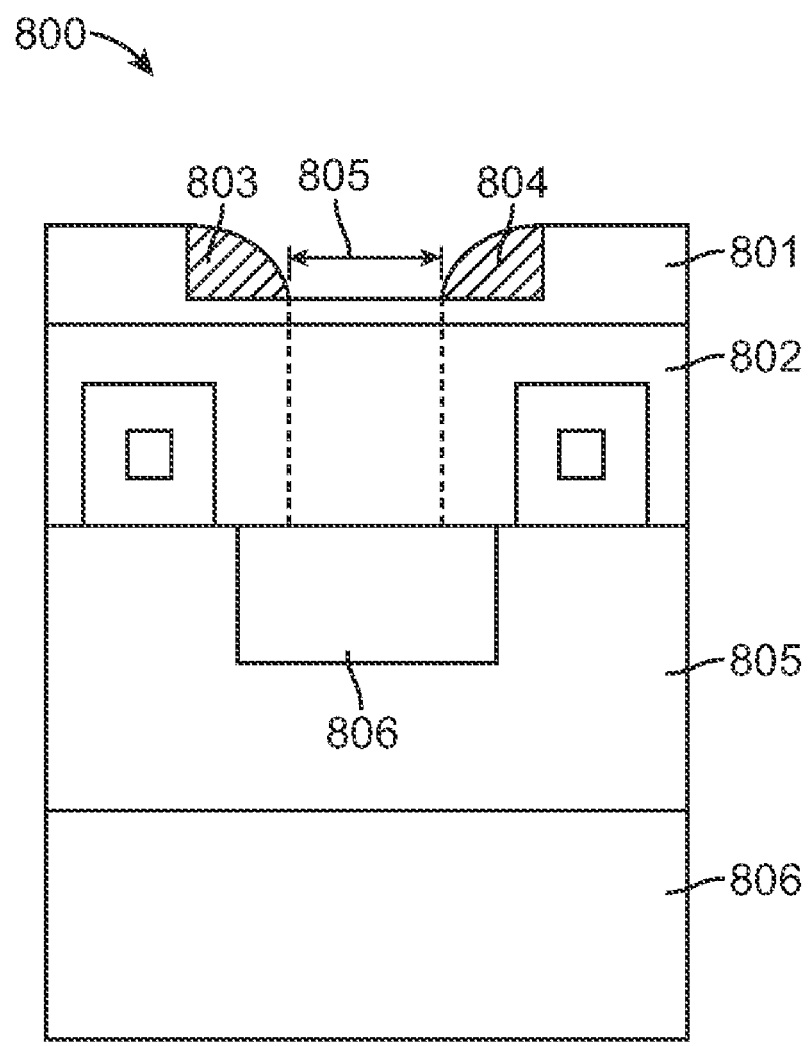
FIG. 8 is a simplified diagram illustrating a partially processed integrated circuit according to an embodiment of the present invention.

FIG. 8 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As can be seen in FIG. 8, the exposed region 805 within layer 801 is redefined and narrowed by the spacers 803 and 804. As an example, the exposed region 805 is narrower than the space between the address lines and is positioned directly above the contact 806, which is posited in the dielectric layer 805.

Now referring back to FIG. 2. At step 211, contact etching is performed. According to an embodiment, contact etching is performing through the exposed region, which is defined by the hard mask. As an example, the selectivity between the hard mask material (e.g., polysilicon material) and the dielectric layer material (e.g., oxide material) is high. As a result, during the etching process a contact hole is formed with a size that is approximately equal to the exposed region.

Figure 9:
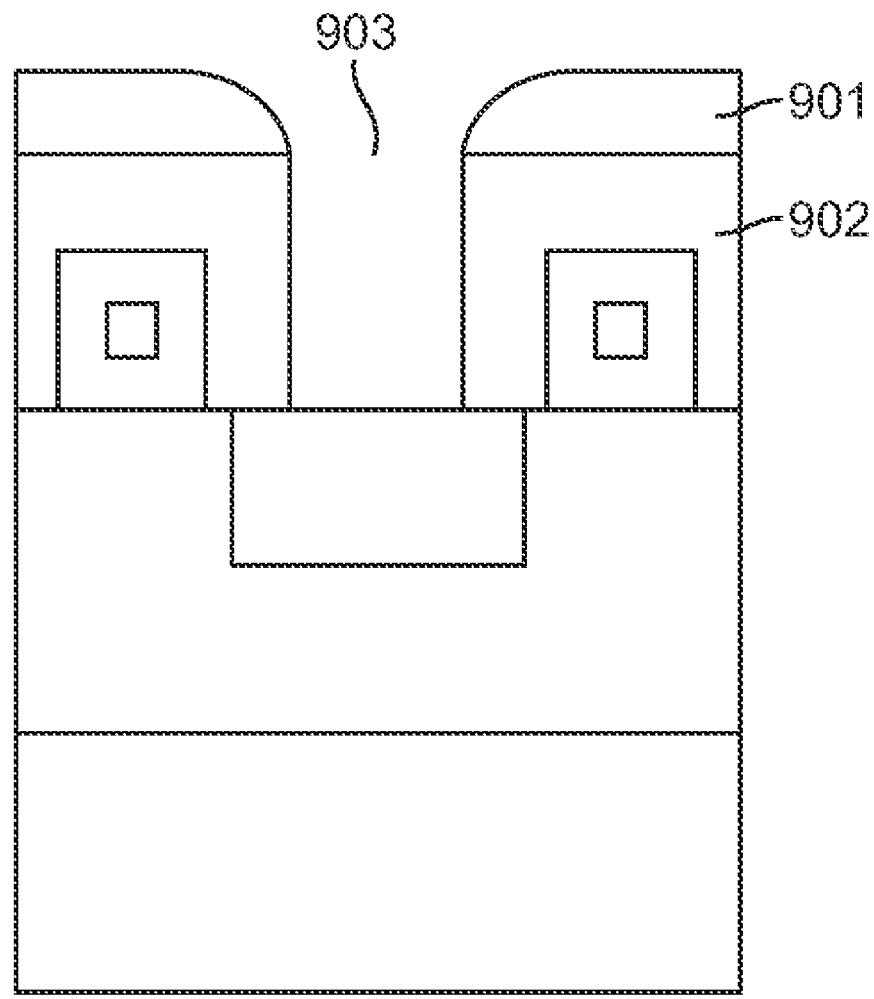
FIG. 9 is a simplified diagram illustrating a partially processed integrated circuit according to an embodiment of the present invention.

FIG. 9 is a simplified diagram illustrating a partially processed integrated circuit according to an embodiment of the present invention. This diagram is merely an example, which should not unduly limit the scope of the claims. One of ordinary skill in the art would recognize many variations, alternatives, and modifications. As can be seen in FIG. 9, a contact opening 903 is formed within the dielectric layer 902. The size of the opening 903 is determined by the hard mask and is less than the space between the address lines. As an example, address spacers are not used as a "mask" for the purpose of contact etching.

Now referring back to FIG. 2. At step 212, a contact is formed. According to various embodiments, various types of electrically conductive material may be used for forming the contact. For example, tungsten is used for forming the contact. In another example, polysilicon material is used for forming the contact. After the contact is formed, other processes may be performed. For example, the hard mask may be removed after the contact is formed.

Figure 10:
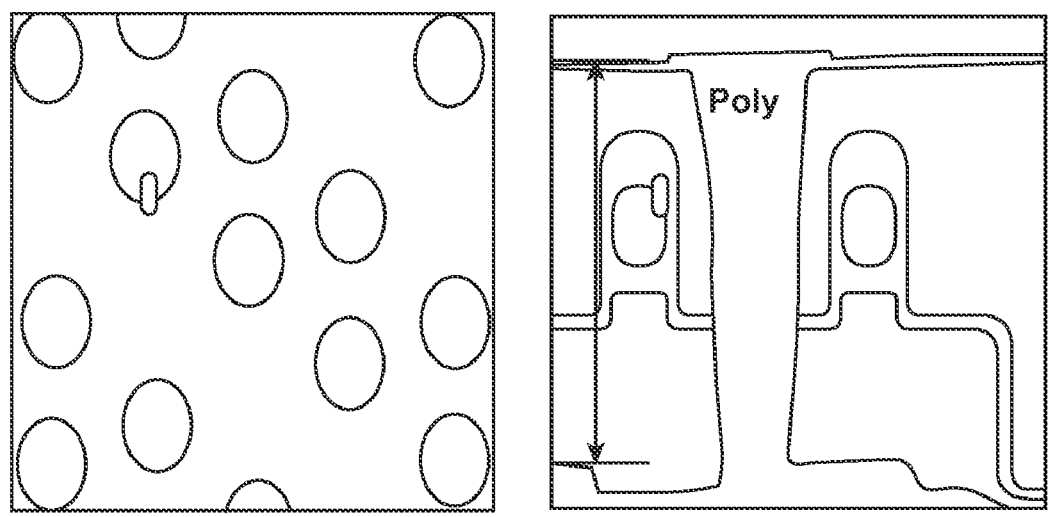
FIG. 10 is a scanning electron microscope diagram of a contact structure forming in according with an embodiment of the present invention.

It is to be appreciated that various embodiments of the present invention provide advantages over conventional techniques. To further demonstrate the advantages and practicability of the present invention, FIG. 10 is provided. FIG. 10 is a scanning electron microscope diagram of a contact structure forming in according with an embodiment of the present invention. As shown, the spacers of the address lines are not used as a mask and were untouched during the contact etching process.

According to an embodiment, the present invention provides a method for manufacturing an integrated circuit device. The method includes a step for providing a substrate having a contact region, which is provided between a first word line and a second word line. The contact region has an overlying plug structure, which is provided within a thickness of a first dielectric layer. The first dielectric layer includes a portion overlying the plug structure. The first dielectric layer has a planarized surface region. The method also includes a step for forming a first line and a second line and a space provided between the first word line and the second world line. The space is provided within a region overlying the plug structure. Additionally, the method includes a step for forming a plurality of spacers, which include a first spacer overlaying the first line and a second spacer overlaying the second line. For example, the first spacer is characterized by a width and a height. The method also includes a step for forming a second dielectric layer overlying the plurality of spacers. Also, the method includes a step for planarizing the second dielectric layer. Moreover, the method includes a step for forming a hard mask. Additionally, the method includes a step for patterning the hard mask to form a first exposed region. Furthermore, the method includes a step for forming a thickness of spacer material. The method also includes a step for performing anisotropic etching the thickness of the spacer material to form a second exposed region within the first exposed region. The second exposed region is defined by a first sidewall spacer on a first edge of the first exposed region and a second sidewall spacer on a second edge of the first exposed region. The method also further includes a step for performing an etching process within the second exposed region at a depth to form an opening. Also, the method includes a step for forming a contact within the opening. For example, the embodiment is illustrated according to FIG. 2.

According to another embodiment, the present invention provides a method for manufacturing an integrated circuit device. The method includes a step for providing a substrate having a contact region, which is provided between a first word line and a second word line. The contact region has an overlying plug structure, which is provided within a thickness of a first dielectric layer. The first dielectric layer includes a portion overlying the plug structure. The first dielectric layer has a planarized surface region. The method also includes a step for forming a first line and a second line and a space provided between the first word line and the second world line. The space is provided within a region overlying the plug structure. Additionally, the method includes a step for forming a plurality of spacers, which include a first spacer overlaying the first line and a second spacer overlaying the second line. For example, the first spacer is characterized by a width and a height. The method also includes a step for forming a second dielectric layer overlying the plurality of spacers. Also, the method includes a step for planarizing the second dielectric layer. The method also includes a step for forming a hard mask overlaying the dielectric layer. Furthermore, the method includes a step for patterning the hard mask to form a first exposed region. The method further includes a step for forming a thickness of spacer material. The method also includes a step for forming a second exposed region within the first exposed region, which is defined by a first sidewall spacer on a first edge of the first exposed region and a second sidewall spacer on a second edge of the first exposed region. Moreover, the method includes a step for performing an etching process within the second exposed region at a depth to form an opening. Also, the method includes a step for forming a contact within the opening. In addition, the method includes a step for removing the hard mask. For example, the embodiment is illustrated according to FIG. 2.

Many benefits are achieved by way of the present invention over conventional techniques. For example, the present technique provides an easy to use process that relies upon conventional technology. In some embodiments, the method provides a direct etching process where devices may be manufactured with smaller sizes in comparison to conventional techniques. For example, smaller sizes are achieved by reducing the sizes of spacers used for address lines. Also, various embodiments of the present invention provides more process margin and reduces thermal budges when compared to conventional techniques. Additionally, the method provides a process that is compatible with conventional process technology without substantial modifications to conventional equipment and processes. Depending upon the embodiment, one or more of these benefits may be achieved. These and other benefits will be described in more throughout the present specification and more particularly below.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for manufacturing an integrated circuit device, the method comprising:

providing a substrate having a contact region, the contact region provided between a first word line and a second word line, the contact region having an overlying plug structure, the plug structure being provided within a thickness of a first dielectric layer, the first dielectric layer including a portion overlying the plug structure, the first dielectric layer having a planarized surface region;

forming a first line and a second line and a space provided between the first word line and the second word line, the space being provided within a region overlying the plug structure;

forming a plurality of spacers, the plurality of spacers including a first spacer overlaying the first line and a second spacer overlaying the second line, the first spacer being characterized by a width and a height;

forming a second dielectric layer overlying the plurality of spacers;

planarizing the second dielectric layer;

forming a hard mask;

patterning the hard mask to form a first exposed region;

forming a thickness of spacer material;

performing anisotropic etching the thickness of the spacer material to form a second exposed region within the first exposed region, the second exposed region being defined by a first sidewall spacer on a first edge of the first exposed region and a second sidewall spacer on a second edge of the first exposed region;

performing an etching process within the second exposed region at a depth to form an opening, the etching process removing at least a portion of the dielectric layer; and forming a contact within the opening.

2. The method of claim 1 wherein the contact comprises polysilicon material.

3. The method of claim 1 wherein the first line comprises tungsten material.

4. The method of claim 1 wherein the first line comprises a bit line.

5. The method of claim 1 wherein the first line comprises a word line.

6. The method of claim 1 further comprising removing the hard mask.

7. The method of claim 1 further comprising removing the first sidewall spacer.

8. The method of claim 1 wherein the width is less than 120 angstroms.

9. The method of claim 1 wherein the width is approximately 120 angstroms.

10. The method of claim 1 wherein the etching process does not remove the contact material.

11. A method for manufacturing an integrated circuit device, the method comprising:

providing a substrate having a contact region, the contact region provided between a first word line and a second word line, the contact region having an overlying plug structure, the plug structure being provided within a thickness of a first dielectric layer, the first dielectric layer including a portion overlying the plug structure, the first dielectric layer having a planarized surface region;

forming a first line and a second line and a space provided between the first word line and the second word line, the space being provided within a region overlying the plug structure;

forming a plurality of spacers, the plurality of spacers including a first spacer overlaying the first line and a second spacer overlaying the second line, the first spacer being characterized by a width and a height;

forming a second dielectric layer overlying the plurality of spacers;

forming a hard mask overlaying the dielectric layer;

patterning the hard mask to form a first exposed region;

forming a thickness of spacer material;

forming a second exposed region within the first exposed region, the second exposed region being defined by a first sidewall spacer on a first edge of the first exposed region and a second sidewall spacer on a second edge of the first exposed region;

performing an etching process within the second exposed region at a depth to form an opening, the etching process removing at least a portion of the dielectric layer;

forming a contact within the opening; and removing the hard mask.

12. The method of claim 1 wherein the contact comprises polysilicon material.

13. The method of claim 1 wherein the contact comprises tungsten material.

14. The method of claim 1 wherein the second dielectric layer comprises silicon oxide material.

15. The method of claim 1 wherein the first sidewall spacer comprise polysilicon material.

16. The method of claim 1 wherein the hard mask comprise polysilicon material.

* * * * *